United States Patent
Kirihata et al.

[11] Patent Number: 5,963,489
[45] Date of Patent: Oct. 5, 1999

[54] METHOD AND APPARATUS FOR REDUNDANCY WORD LINE REPLACEMENT IN A REPAIRABLE SEMICONDUCTOR MEMORY DEVICE

[75] Inventors: Toshiaki Kirihata, Poughkeepsie, N.Y.; John K. DeBrosse, Burlington, Vt.; Yohji Watanabe, Kanagawa, Japan; Hing Wong, Los Altos, Calif.

[73] Assignees: International Business Machines Corporation, Armonk, N.Y.; Kabushiki Kaisha Toshiba, Kawasaki, Japan

[21] Appl. No.: 09/047,086

[22] Filed: Mar. 24, 1998

[51] Int. Cl.$^6$ .................................................. G11C 7/00
[52] U.S. Cl. ......................... 365/200; 365/149; 371/10.3
[58] Field of Search ................................. 365/200, 149, 365/225.7; 371/10.2, 10.3

[56] References Cited

U.S. PATENT DOCUMENTS

| | | | |
|---|---|---|---|
| 5,289,417 | 2/1994 | Ooishi et al. | 365/200 |
| 5,295,114 | 3/1994 | Kobayashi | 365/230.06 |
| 5,414,659 | 5/1995 | Ito | 365/200 |
| 5,465,234 | 11/1995 | Hannai | 365/200 |
| 5,555,212 | 9/1996 | Kirihata et al. | 365/200 |

*Primary Examiner*—David Nelms
*Assistant Examiner*—Hoai V. Ho
*Attorney, Agent, or Firm*—H. Daniel Schnurmann

[57] ABSTRACT

A method and apparatus for repairing a semiconductor memory device. A row redundancy replacement arrangement is provided to repair the memory device consisting of a first plurality of redundant true word lines and a second plurality of redundant complement word lines to simultaneously replace the same first number of first normal word lines and the same second number of the normal complement word lines. An address reordering scheme, preferably implemented as a word line selector circuit and controlled by redundancy control logic and address inputs, allows the redundant true (complement) word lines to replace the normal true (complement) word lines when making the repair. The redundancy replacement arrangement ensures that consistency of the bit map is maintained at all times, irrespective whether the memory device operates in a normal or in a redundancy mode. This approach introduces an added flexibility of incorporating the redundancy replacement without affecting the column access speed.

21 Claims, 12 Drawing Sheets

METHOD AND APPARATUS FOR REDUNDANCY WORD LINE REPLACEMENT IN A REPAIRABLE SEMICONDUCTOR MEMORY DEVICE

FIELD OF THE INVENTION

This invention relates generally to the design of a DRAM and, more particularly, to a method and apparatus for maintaining physical scrambling consistency when using redundancy elements.

BACKGROUND OF THE INVENTION

Figure 1:
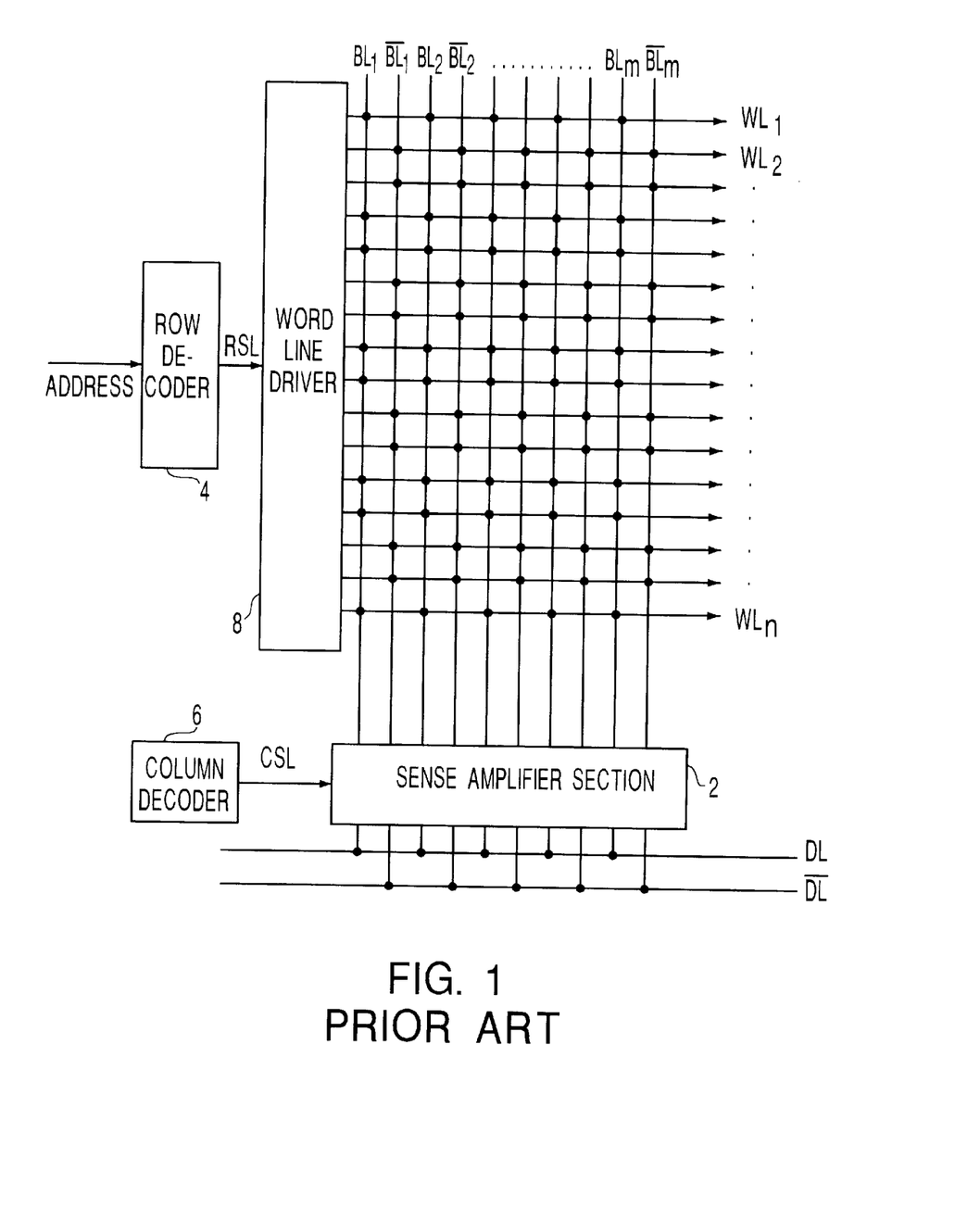
FIG. 1 shows a conventional semiconductor memory architecture.

Typically, a semiconductor memory cell array includes a plurality of memory cells MC arranged in rows and columns and has a plurality of word lines $WL_1, WL_2, \ldots,$ and $WL_n$, which intersect bit line pairs $BL_1$ and $\overline{BL}_1$, $BL_2$ and $\overline{BL}_2$, $BL_3$ and $\overline{BL}_3, \ldots,$ and $BL_m$, $\overline{BL}_m$. A conventional arrangement is depicted in FIG. 1. Memory cells are located at intersections of word lines WL and bit lines BL of a plurality of bit line pairs. Each memory cell includes a capacitor for storing data and a MOS transistor for switching. A sense amplifier section 2 including a plurality of sense amplifiers is responsive to a column selection signal CSL and transfers data between selected memory cells and a pair of data lines DL, $\overline{DL}$.

An address buffer (not shown) receives external address signals which are decoded by a row decoder 4 and a column decoder 6. The row decoder 4 supplies a word line selecting signal RSL to a word line driver 8 which drives a word line selected in accordance with the address signals. A column decoder 6 supplies the column selecting signal CSL to the sense amplifier section 2 to effect data transfer between the data lines DL, $\overline{DL}$ and the column selected BL, $\overline{BL}$ in accordance with the addressed signals.

Figure 2:
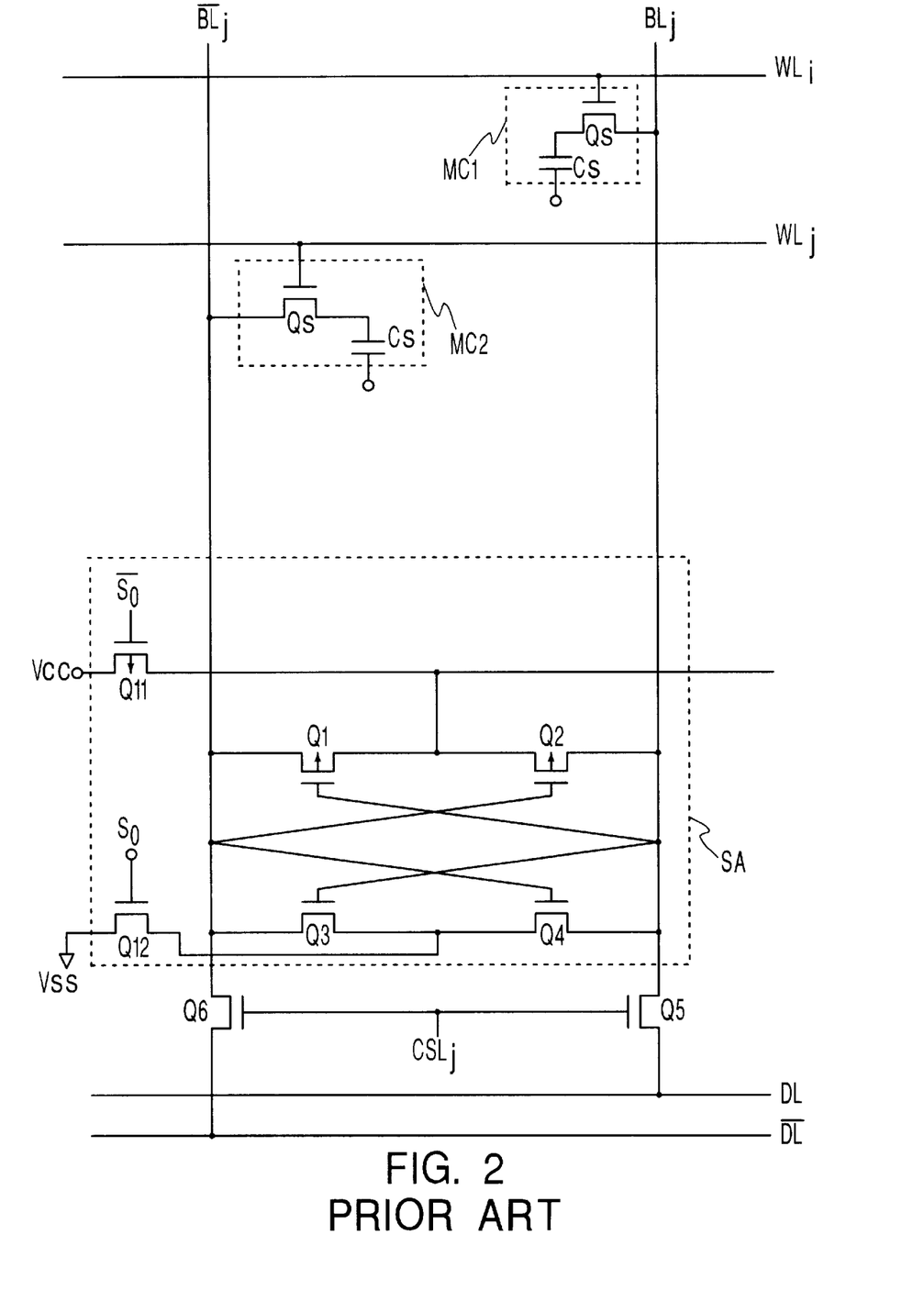
FIG. 2 shows a more detailed conventional semiconductor memory architecture according to FIG. 1.

FIG. 2 is a detailed description of a portion of the arrangement shown in FIG. 1. Referring to FIG. 2, a word line $WL_i$ is connected to a gate of a MOS switching transistor Qs in a memory cell MC1. When the transistor Qs of memory cell MC1 is switched on by a signal on word line WLi, a data signal is transferred between the capacitor Cs of the memory cell MC1 and a bit line $BL_j$ connected to the memory cell MC1. In a reading operation, for example, the bit lines $BL_3$ and $\overline{BL}_3$ of the illustrated bit line pair are pre-charged to a pre-charge voltage ½Vdd (½Vdd sensing). Similarly, a word line $WL_j$ is connected to a gate of a MOS switching transistor Qs in a memory cell MC2. When the transistor Qs of memory cell MC2 is switched on by a signal on word line $WL_j$, a data signal is transferred between the capacitor Cs of the memory cell MC2 and a bit line $\overline{BL}_j$ connected to the memory cell MC2. When data stored in one of the memory cells is read onto one of the bit lines, a potential difference is generated between bit lines $BL_j$ and $\overline{BL}_j$ of the bit line pair. A bit line sense amplifier SA connected to the bit line pair $BL_j$ and $\overline{BL}_j$ senses and amplifies this potential difference. As shown in FIG. 2, sense amplifier SA includes a CMOS flip-flop connected between the bit line $BL_j$ and $\overline{BL}_j$. The CMOS flip-flop which includes transistors Q1, Q2, Q3, and Q4 is connected via a PMOS transistor Q11 and an NMOS transistor Q12 to a power source Vdd and ground Vss, respectively. The gates of transistors Q11 and Q12 receive trigger signals $S_o$ and $S_o$, respectively. Data signals are transferred between the bit lines $BL_j$, $BL_j$ and the data lines DL, $\overline{DL}$ when the column j has been selected, in response to a signal $CSL_j$ supplied from column decoder 6 (FIG. 1) to the I/O gate transistors Q5 and Q6.

As the capacity of the semiconductor memory devices increases, the possibility that the devices will contain one or more defective memory cells also increases. This problem adversely affects the yield of the semiconductor memory device manufacturing process. One technique for dealing with this problem is to utilize redundancy memory cells which are provided in a semiconductor memory device to replace memory cells which have been determined to be defective during device testing. Accordingly, a word line or a bit line to which a defective memory cell is connected may be replaced by a redundant line attached to redundant memory cells. An address of a defective memory cell may be programmed by blowing appropriate ones of the fuses in a redundancy control circuit. A redundant memory cell is selected when an address corresponding to a defective memory cell is an input.

Figure 3:
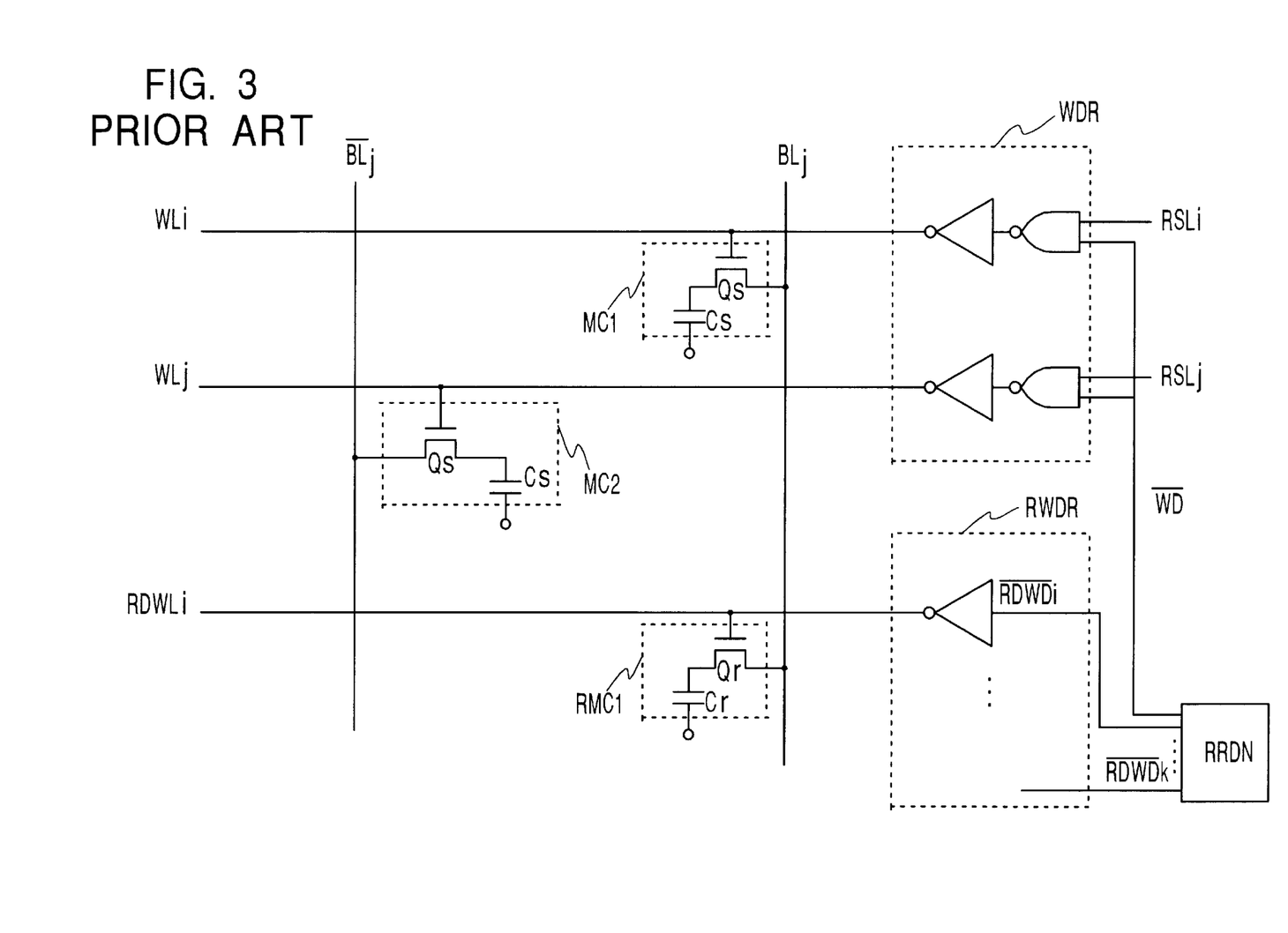
FIG. 3 illustrates a portion of a conventional DRAM with row redundancy and a row redundancy control circuit.

FIG. 3 illustrates a portion of a convention dynamic random access memory (DRAM) with row redundancy. Such a memory arrangement is described in U.S. Pat. No. 5,555,212 issued to Toshiaki Kirihata et al., of common assignees, which is herein incorporated by reference. The memory portion includes memory cells MC1, MC2 and a redundant memory cell RMC1. The memory cells MC1 and MC2 are formed by respective data storage capacitors Cs and transfer transistors Qs. The redundant memory cell RMC1 is formed by a data storage capacitor Cr and a transfer transistor Qr. The gates of the transfer transistors Qs of memory cells MC1, MC2 are respectively connected to word lines $WL_i$ and $WL_j$. The gate of the transfer transistor Qr of redundant memory cell RMC1 is attached to a redundant word line $RDWL_i$. External address signals are supplied via an address buffer (not shown) to a row decoder which generates word line selecting signals (RSLi, RSLj, ..., etc.). The address buffer forwards address signals to redundancy control circuit RRDN. RRDN generates a word line drive signal $\overline{WD}$ and redundant word line drive signals $\overline{RDWD}_1$, $\overline{RDWD}_2, \ldots,$ and $\overline{RDWD}_j$. WD is activated when a memory cell on a normal word line is accessed, whereas one of the $\overline{RDWD}$s becomes active when one of the redundant memory cells on a redundant word line is accessed. Signals $\overline{WD}$ and $\overline{RDWD}_1$, $\overline{RDWD}_2, \ldots,$ and $\overline{RDWD}_j$, are respectively forwarded to word line driver WDR and to the redundant word line driver RWDR. For each word line, the word line driver WDR is implemented as an AND gate. At each AND gate, WD is gated with the respective word line selecting signal RSL. When the word line $WL_i$ is driven by word line driver WDR, data may be read out or written in the data storage capacitor Cs of memory cell MC1 via bit line $BL_j$. Similarly, when the word line $WL_j$ is driven by the word line driver WDR, data may be read out or written in the data storage capacitor Cs of the memory cell MC2 via bit line $\overline{BL}_j$. The redundant memory cell RMC1 may replace either memory cell MC1 or MC2 if it is determined that one of these cells is defective. However, it can be seen that if the redundant memory cell RMC1 replaces the memory cell MC2, the physical data stored in capacitor Cr of redundant memory cell RMC1, representing a given logical data bit, will be inverted with respect to the physical data stored in capacitor Cs of memory cell MC2, representing the same given logical data bit. In general, in semiconductor memory cell devices such as DRAMs, two logic states correspond to the arrangement and composition of the memory cell array. Half the memory cells equal the true state of data to be read or written, while the other half corresponds to the complementary state.

When a defective memory cell is detected and replaced by a redundant memory cell, the physical data state (i.e., bit pattern) in which a given bit is stored in a substituted redundant memory cell may differ (i.e., be inverted) from the physical data state in which the given bit is stored in the replaced memory cell.

Figure 4:
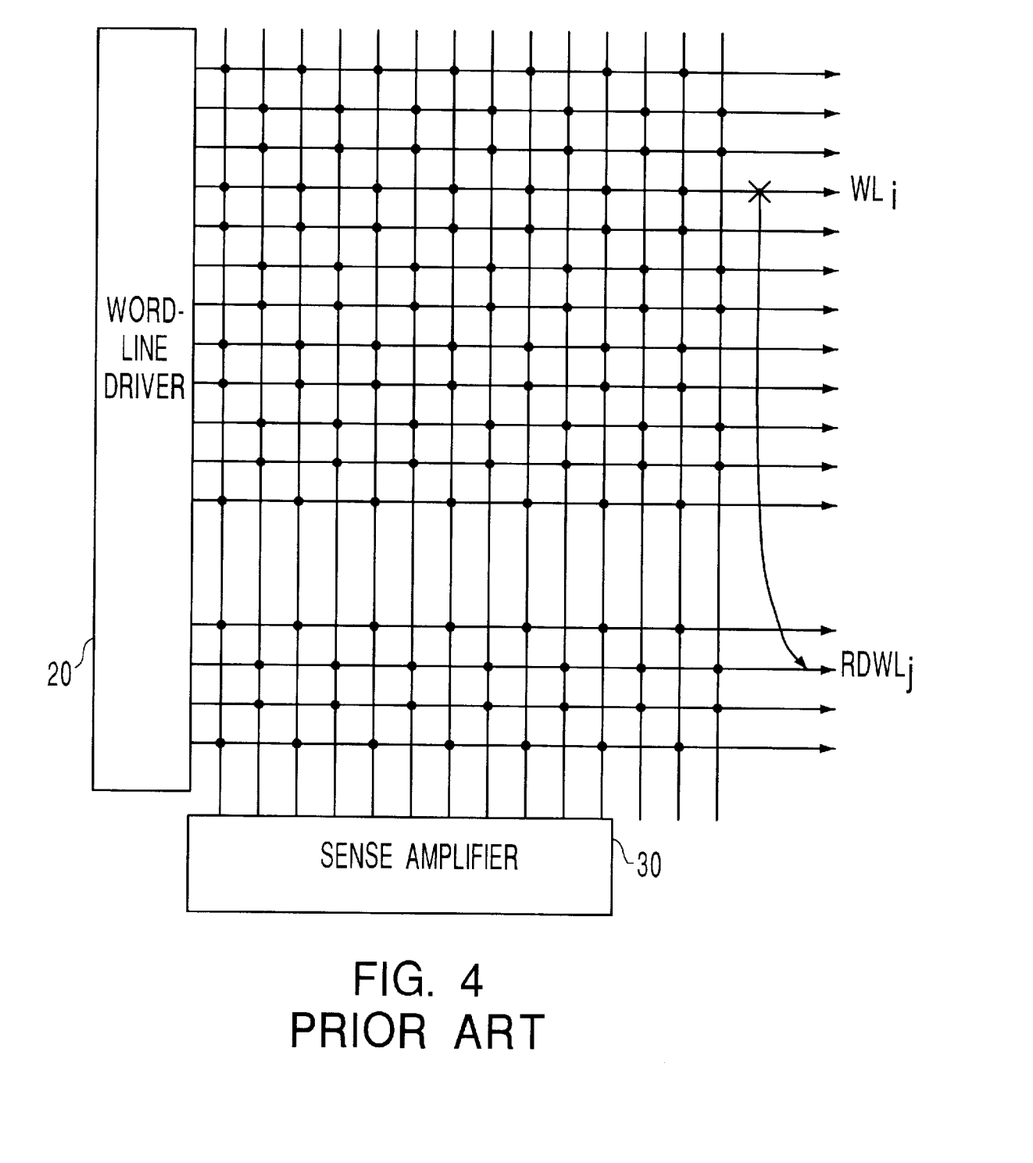
FIG. 4 shows a conventional row redundancy architecture.

Shown in FIG. 4 are word line drivers 20, a memory cell array including a word line WLi, a redundant memory cell array including a redundant word line RDWLJ, and sense amplifiers 30. According to this arrangement, a redundant word line, such as $RDWL_j$, may be substituted for a defective word line $WL_i$. When $RDWL_j$ replaces $WL_i$, the bit information will be inverted because the physical data states of the memory cells respectively coupled to word lines $WL_i$ and $RDWL_j$ are complementary. As a result, this architecture fails to maintain the original physical bit information. Consequently, during testing of the semiconductor memory device, both the logical 1 and logical 0 data, must be supplied to the memory device in order, for example, to write physical 1 data to all the memory cells including the redundant memory cells. Likewise, both logical 1 and logical 0 data must be supplied to the memory device in order to write physical 0 data to all the memory cells including the redundant memory cells. The testing time for such a scheme is, therefore, long.

The conventional approach that has successfully been used to overcome this problem is further described in the aforementioned U.S. Pat. No. 5,555,212, wherein the data pattern on the DL pairs is manipulated when a bit map inconsistency occurs. By way of example, when WLj, which couples BL and DL to CSL, is replaced with RDWLj, which couples $\overline{BL}$ and $\overline{DL}$ to CSL, the data pattern on DL and $\overline{DL}$ ends up being swapped. The inverted data pattern to the corresponding $\overline{BL}$ is transferred, allowing consistency of the bit map to be maintained. It requires, however, that logic be incorporated on the data path, which results in a substantial penalty on the column access speed.

OBJECT OF THE INVENTION

Accordingly, it is a primary object of the present invention to make a DRAM fault tolerant.

It is another object of the invention to maintain physical scrambling capabilities in the DRAM in instances when sections of an array are replaced with redundant elements.

It is a further object of the invention to provide a redundancy architecture that guarantees bit map consistency, without affecting the column access speed.

It is still another object of the invention to use redundant elements having the same number of true-complement (TC) sub-elements that require replacement, together with appropriate decoding of the redundant elements, thereby obviating the need for flipping data.

It is yet another object of the invention to provide word line address swapping to maintain electrical correspondence when storing and retrieving data from a DRAM.

It is a more particular object of the invention to reduce test time by ensuring bit map consistency.

SUMMARY OF THE INVENTION

An illustrative semiconductor device according to the present invention includes memory cells arranged in rows and columns, the memory cells including normal memory cells and redundant memory cells for replacing defective ones of the normal memory cells. Bit line pairs are connected to the memory cells, each bit line pair consisting of first and second bit lines which are respectively connected to memory cells in a corresponding one of the columns. The word lines include normal word lines each respectively connected to normal memory cells in a corresponding one of the rows and redundant word lines each respectively connected to redundancy memory cells in a corresponding one of the rows.

Unlike the conventional single WL replacement presently being used, in order to make a repair, two or more WLs, at least two of which respectively couple BL and $\overline{BL}$, are replaced with two or more RWLs, at least two of which respectively couple BL and $\overline{BL}$, are replacements taking place simultaneously. A circuit is included to reorder the addressing sequence of either word lines or redundancy word lines when they become enabled. The addressing sequence is recorded to maintain bit map consistency, if any inconsistencies were to occur.

In accordance with the present invention, the column access speed penalty is eliminated and testing time reduced while maintaining original physical data information. For example, test times can be reduced by one-half for which only physical 1 or physical 0 data are tested in an NMOS and PMOS array, respectively. The test time of the signal margin can also be cut in half because the margin of the physical 1 or physical 0 data can be tested by applying only a higher or a lower reference voltage to the reference cell or bit line.

BRIEF DESCRIPTION OF THE DRAWINGS

While the specification concludes with claims particularly pointing out and distinctly claiming what is regarded as the present invention, details of a preferred embodiment of the invention may be more readily ascertained from the technical description when read in conjunction with the accompanying drawings in which:

DETAILED DESCRIPTION OF A PREFERRED EMBODIMENT INVENTION

Whereas the present invention is discussed below with reference to a dynamic random access memory (DRAM), it also extends to other types of semiconductor memory devices, such as SRAMs, ROMS, EPROMs, EEPROMS, Flash RAMS, FRAMs, CAMs, and the like. By way of example, the preferred embodiment particularly addresses a DRAM using half-pitch non-twisting bit lines, but the conclusions also extend to any DRAM or memory architecture, including those having twisted bit lines or quarter-pitch layout.

Figure 5:
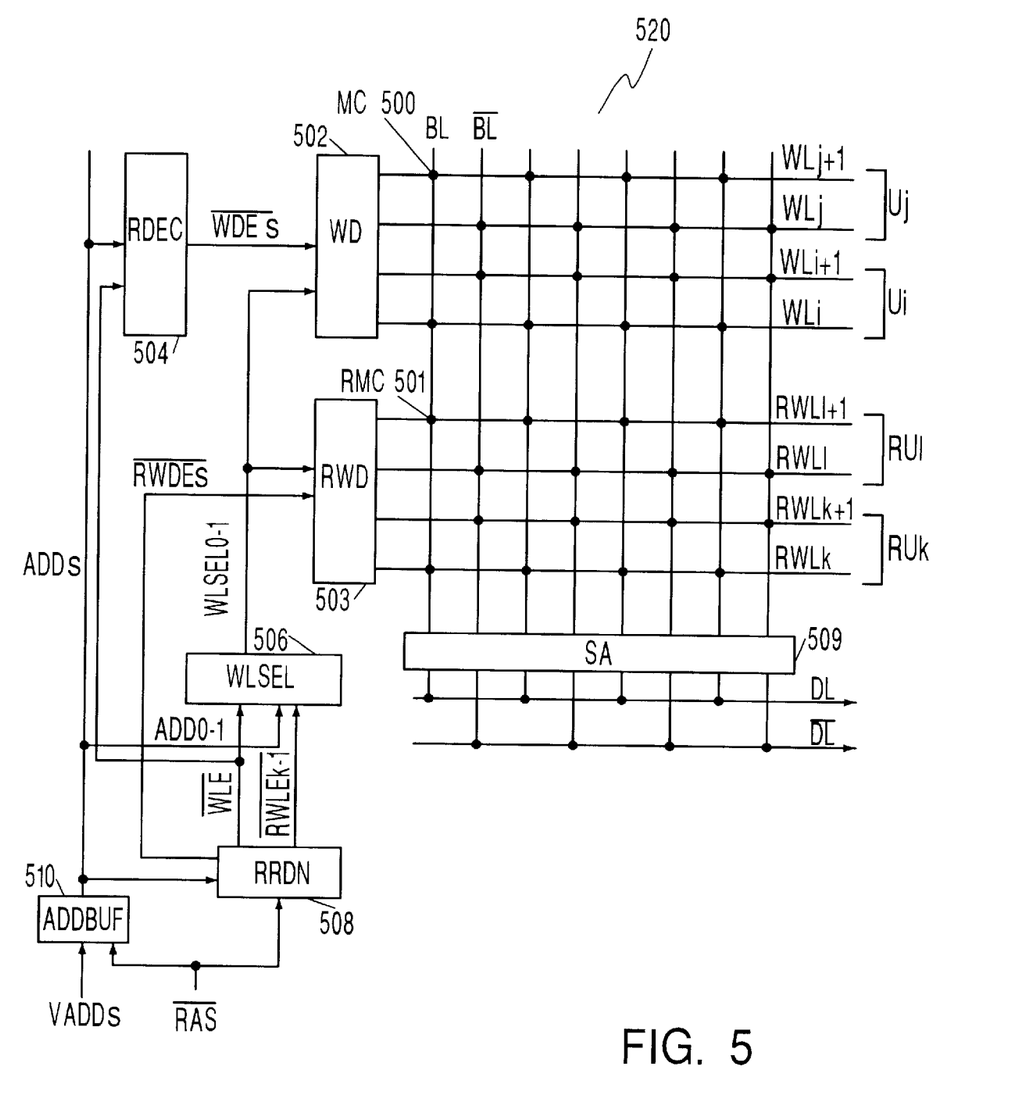
FIG. 5 shows a memory array configuration for a fault tolerant semiconductor device provided with redundancy line replacement arrangement, according to the present invention.

FIG. 5 illustrates a semiconductor memory device (520) including memory cells MC (500), each of which is coupled to the corresponding word line WL and bit line BL; word line drivers WD (502); row decoders RDEC (504); word line select circuit WLSEL (506); redundancy memory cells RMC (501), each of which is coupled to the corresponding redundancy WL (RWL) and bit line BL (or $\overline{BL}$); redundancy word line drivers RWD (503); row redundancy control circuits RRDN (508); sense amplifiers SA (509); and address buffers ADDBUF (510). Column related circuits, such as column decoders, second sense amplifiers, and I/O circuitry are not pertinent to the discussion and, therefore, are not illustrated. They are, however, required for the actual design implementation.

In order for a repair to take place, the two WLs (forming unit U), respectively coupling BL and $\overline{BL}$, are simultaneously replaced with the two RWLs (forming redundant unit RU) that respectively couple BL and $\overline{BL}$. The pair WLi and WLi+1 and the pair WLj and WLj+1 configure unit Ui and Uj, where i and j are, respectively, 4n and 4n+2 (n being an integer number). Similarly, the pair formed by redundant word lines RWLk and RWLk+1 and the pair formed by RWLl and RWLl+1 configure the redundancy unit RUk and RUl, where k and l are, respectively, 4n and 4n+2 (n being again an integer number).

For a redundant replacement to take place, one of the following four cases are applicable:

(1) RUk replaces Ui, (1) RUk replaces Uj, (1) RUl replaces Ui, and (1) RUl replaces Uj.

The following discussion assumes that the addressing sequence of WL (or RWL) within each unit U (or RU) is controlled by WLn and WLn+1 (where n=i or j for U or k or l for RU). When making a conventional replacement, a bit map inconsistency occurs in Case 2 when RWLk (coupled to BL) and RWLk+1 (coupled to $\overline{BL}$) replace WLj (coupled to $\overline{BL}$) and WLj+1 (coupled to BL), respectively, as it is routinely done in a conventional addressing sequence. Similarly, when making a conventional replacement, a bit map inconsistency occurs in Case 3 when RWLl (coupled to $\overline{BL}$) and RWLl+1 (coupled to BL), respectively replace WLi (coupled to BL) and WLi+1 (coupled to $\overline{BL}$). In order to overcome the problem present in Cases 2 and 3, the RWL addressing within a RU is reordered according to the case number of the replacement. More specifically, the addressing sequence of RWL within the corresponding unit RU is reordered from RWLn and RWLn+1 to RWLn+1 and RWLn (where n=k or l). Because of this reordering, the bit map inconsistency problem will be overcome upon completion of the replacement, even for Case 2, in which RWLk+1 (coupled to $\overline{BL}$) and RWLk (coupled to BL) respectively replace WLj (coupled to $\overline{BL}$) and WLj+1 (coupled to BL). Similarly, because of the reordering, the bit map inconsistency problem will be overcome after replacement, even if it occurs in Case 3, wherein RWLl+1 (coupled to BL) and RWLl (coupled to $\overline{BL}$) respectively replace WLi (coupled to BL) and WLi+1 (coupled to $\overline{BL}$).

Still referring to FIG. 5, address buffer ADDBUF (510) receives external address signals VADDs and internal address signal ADDs which are then fed to row decoders RDEC (504), word line selector WLSEL (506), and redundant control RRDN (508). Redundant control circuit RRDN (508) compares ADDs with predetermined addresses to enable a redundant replacement. When in normal mode, if the inputs ADDs do not match the predetermined addresses, the block RRDN activates a signal $\overline{WLE}$ which, in turn, enables RDEC (504) and WLSEL (506). Row decoders RDEC (504) decode the signals ADDs and activate a signal $\overline{WDE}$ which enables the word line drivers WD (502). Circuit WLSEL (506) activates either signals WLSEL0 or WLSEL1. WLSEL0 is activated when the least significant address 0 switches to a low. In turn, WLSEL1 is activated when the least significant address 0 switches to a high.

The following discussion assumes signal $\overline{WDEi}$ to be stimulated by block RDEC (504). When WLSEL0 is activated, the corresponding WLi is triggered by the resulting selection of signal $\overline{WDEi}$ and by activating WLSEL0 in block WD (502). When WLSEL1 is active, the corresponding WLi+1 is stimulated by the resulting selection of the signal $\overline{WDEi}$ and by activating WLSEL1. Once the corresponding WL selection has taken place, sense amplifiers SA (509) amplify the read data on the BL pairs, the data of which is then transferred to data lines DL pairs in a conventional manner. No RWLs are activated, though, since no $\overline{RWDE}$s are enabled when in normal mode.

When in a redundant mode, if the inputs ADDS match the predetermined addresses, RRDN (508) generates a signal $\overline{RWDE}$ which enables one of the circuits in RWD (503). When $\overline{RWLEk}$ (or RWLEl) is activated by RRDN (508), $\overline{RWLEk}$ becomes operative when the repair unit RUk is used as a replacement. Alternatively, $\overline{RWEl}$ is energized when the repair unit RUl is used as a replacement. In the present example, only two redundant units RUs have been described; however, this concept is applicable to any number of RUs.

Either input $\overline{RWLEk}$ or $\overline{RWLEl}$ enables the word line select circuit WLSEL. This circuit manages the order of the address sequencing to ensure bit map consistency by reordering either WLSEL0 or WLSEL1. When no bit map inconsistency occurs, (e.g., as in Cases 1 and 4), WLSEL0 is activated when the least significant address 0 switches to a low, while WLSEL1 is activated when the least significant address 0 switches to a high, as it is commonly practiced in the art.

The following discussion assumes the repair unit RUk to act as a replacement unit. Block RRDN (508) activates signals $\overline{RWDk}$ and $\overline{RWLEk}$. Circuit WLSEL determines the order of the address sequencing of RWLk and RWLk+1 contained in the repair unit RUk, activating either WLSEL0 and WLSEL1. When WLSEL0 is activated, the redundant word line RWLk is energized by the resulting selection of $\overline{RWDEk}$ and by activating WLSEL0. When WLSEL1 is stimulated, the redundant word line RWLk+1 is energized by the resulting selection of $\overline{RWDEk}$ and by activating WLSEL1. After RWL has been appropriately activated, sense amplifier SA (509) amplifies the read data on the BL pairs, the data of which is then transferred to the data lines DL pairs, as it is commonly practiced in the art. WD block (502) is not operative since $\overline{WLE}$ is not activated. This, in turn, disables WL, regardless of the address inputs (ADDs).

Figure 6:
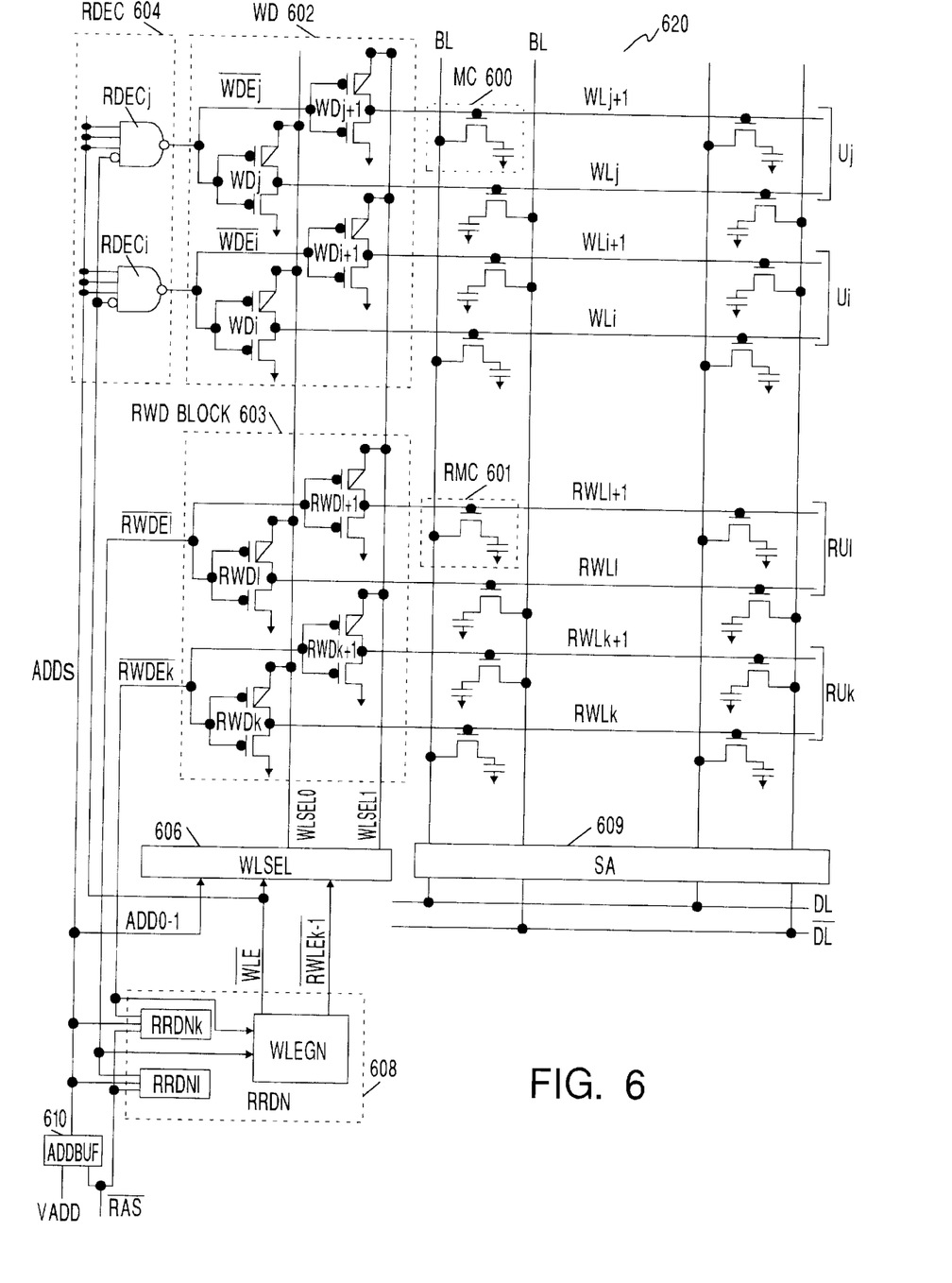
FIG. 6 illustrates a detailed portion of the fault tolerant memory device of FIG. 5 using NAND gates.

FIG. 6 is a gate level representation of memory cells MC (600), WL drivers WD (602), row decoders RDEC (604), redundant memory cells RMC (601), RWL drivers RWD (603), sense amplifiers SA (609), word line select WLSEL (606), row redundant control circuits RRDN (608), and address buffers ADDBUF (610).

Block RDEC (604) consists of a plurality of row decoders RDECi, . . . , RDECj, preferably configured using NAND gates. The inputs of row decoders RDEC have each a different address combination and only one corresponding RDEC is activated according to the unique address inputs. Block RRDN (608) includes two row redundant control circuits RRDNk and RRDNl, as well as a word line enable generator WLEGN.

Chip (620) is energized when row address strobe $\overline{RAS}$ switches to a low. $\overline{RAS}$ enables address buffers ADDBUF (610), driving the signals ADDs. $\overline{RAS}$ also enables the row redundant control circuits RRDN (608). In a normal mode, block RRDN (608) activates $\overline{WLE}$. Having signals $\overline{RWLEk}$ and $\overline{RWLEl}$ at a high disables the redundancy operation. Row decoder block RDEC (604) turns on when the signal $\overline{WLE}$ switches to a low. The corresponding row redundant control circuit RDEC (i.e., RDECi or RDEDj) in RDEC block (604) is thus stimulated, activating the corresponding output signal $\overline{WDE}$ (i.e., $\overline{WDEi}$ or $\overline{WDEj}$). Simultaneously, the circuit WLSEL (606) activates either WLSEL0 or WLSEL1.

The following discussion assumes that $\overline{WDEi}$ is activated by RDECi and that WLSEL0 is turned on by WLSEL (606). Referring to block WD (602), the corresponding word line WLi is turned on as a result of $\overline{WDEi}$ coupling the gate of the CMOS word line driver WDi, and the signal WLSEL coupling the PMOS source of the CMOS word line driver WDi. No RWLs are turned on, since both signals $\overline{RWDEk}$ and $\overline{RWDEl}$ remain at a high.

When in redundancy mode, the signal $\overline{WLE}$ is kept at a high, disabling the row decoder RDEC 604, regardless of the binary values of the ADD inputs. On the other hand, RRDN (608) turns on one $\overline{RWDE}$, namely, $\overline{RWDEk}$ or $\overline{RWDEl}$, in RWD (603). The circuit WLSEL alters the sequence of the RWL selection within each RU by reordering the activity sequencing of signals WLSEL0 and WLSEL1. By way of example, when RUk, consisting of RWLk and RWLk+1, replaces Ui, consisting of WLi and WLi+1, the addressing order of the signals WLSEL0 and WLSEL1 are first WLSEL0, followed by WLSEL1 next, regardless as to whether it is in a normal or in a redundancy mode. When RUk, consisting of RWLk and RWLk+1, replaces Uj, consisting of WLj and WLj+1, the addressing order of signals WLSEL0 and WLSEL1 is reversed when in redundancy mode, to WLSEL1 first and WLSEL0 next. Similarly, when RUl, consisting of RWLl and RWLl+1, replaces Ui, consisting of WLi and WLi+1, the addressing order of the signals WLSEL0 and WLSEL1 is reversed when in redundancy mode, to WLSEL1 first and WLSEL0 next. When RUl, consisting of RWLl and RWLl+1, replaces Uj, consisting of WLj and WLj+1, the addressing order of the signals WLSEL0 and WLSEL1 is kept to WLSEL0 first and WLSEL1 next, regardless whether in a normal or a redundancy mode. A redundant word line RWL (i.e., RWLk, RWLk+1, RWLk+1, RWLl, or RWLl+1) is activated by block RWD (603) when both, the corresponding signal $\overline{RWDE}$ ($\overline{RWDEj}$ or $\overline{RWDEl}$) and the corresponding signal WLSEL (WELSEL0 or WLSEL1) are active.

Figure 7:
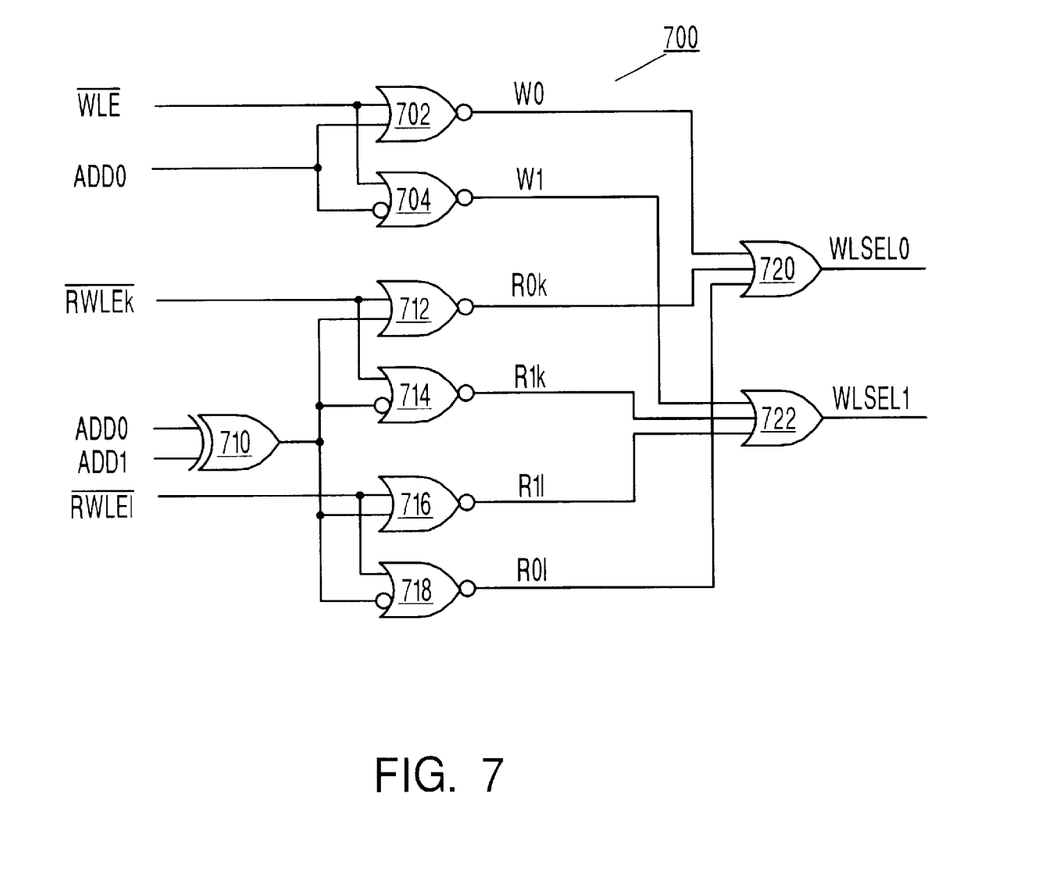
FIG. 7 shows a gate level schematic of the word line select circuit WLSEL depicted in FIG. 5.

FIG. 7 is a more detailed representation of a portion of the circuitry shown in FIGS. 5 and 6, and refers more particularly to the word line select circuit WLSEL (700) which uses as inputs the least significant addresses ADDO and ADD1, and the signals $\overline{WLE}$, $\overline{RWLEk}$ and $\overline{RWLEl}$. When in normal mode, the signal $\overline{WLE}$ switches to a logical 0 keeping $\overline{RWLEk}$ and $\overline{RWLEl}$ at a high. When the least significant address ADD0 is at logical 0, signal W0 is activated by gate 702. Gate 720 activates WLSEL0 when W0 switches to a logical 1. When the least significant address ADD0 is at a 1, W1 is activated by gate 704. Gate 722 energizes WLSEL1 when W switches to 1. Gates 712, 714, 716, and 718 remain disabled as long as signals $\overline{RWLEk}$ and $\overline{RWLE1}$ are kept at 1. The addressing sequence of the signal WLSEL starts with WLSEL0 and is followed by WLSEL1, when in normal mode. When in redundancy mode, $\overline{WLE}$ remains at a logical 1, which disables gates 702 and 704. On the other hand, either $\overline{RWLEk}$ or $\overline{RWLEl}$ switch to 0. The following discussion assumes that gates 712 and 714 are enabled by $\overline{RWLEk}$ shifting to 0. When ADD0 and ADD1 are both at a low (high), R0k becomes operative. When ADD0 and ADD1 are, respectively, at a high and at a low (or, conversely, at a low and at a high), R1k is activated. The addressing sequence of the signal WLSEL is, therefore, the same as the previously described normal mode sequence for WLSEL0, WLSEL1; however, here the order of WLSEL0 and WLSEL1 is reversed. This reordering ensures bit map consistency even if redundant unit RUk replaces unit Uj, which have a reversed bit map. Similarly, when $\overline{RWLEl}$ switches to a low, gates 716 and 718 become operative. When ADD0 and ADD1 are both at a low (high), R1l is energized. When ADD0 and ADD1 are, respectively, at a high and at a low (or at a low and at a high) R0l becomes active. The addressing sequence of the signal WLSEL is, therefore, WLSEL1, followed by WLSEL0, i.e., the reversed order of WLSEL0 and WLSEL1 described for the normal mode. This reordering allows for bit map consistency even when RUl replaces Ui, but having a reversed bit map unless a reordering scheme is implemented.

Figure 8:
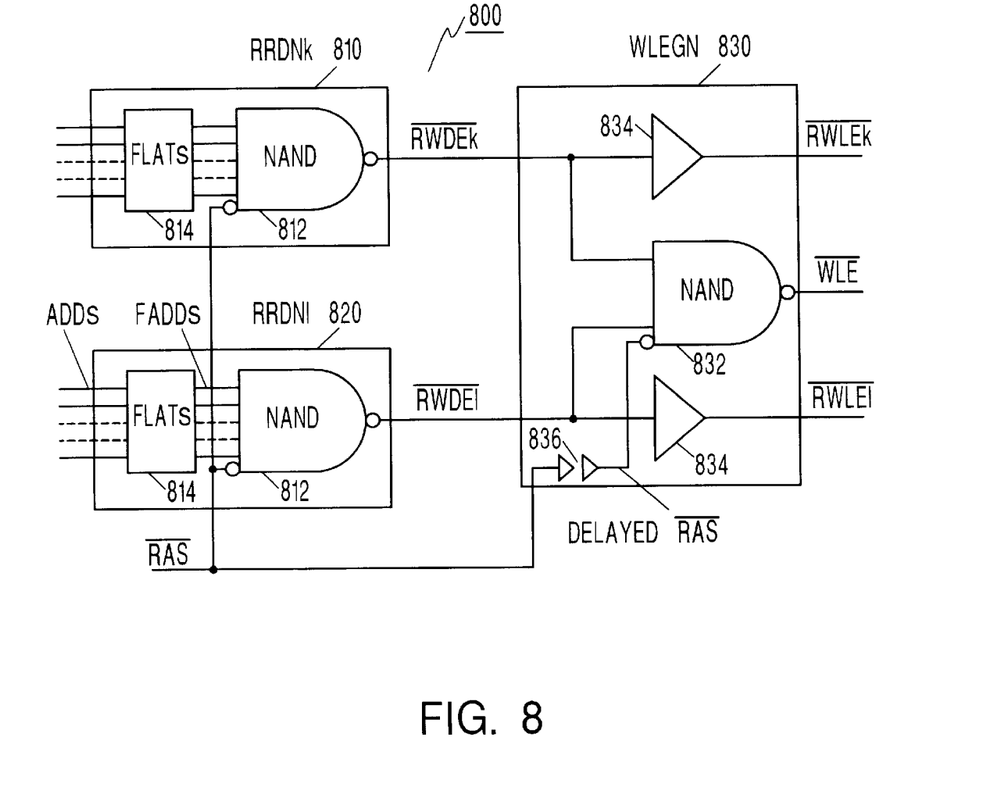
FIG. 8 shows a gate level schematic of the row redundancy block RRDN depicted in FIG. 5.

FIG. 8 shows a gate level schematic of the row redundant control block RRDN. Row redundant block (800) consists of row redundant control circuits RRDNk (810), RRDN1 (820), and word line enable generator WLEGN (830). RRDN consists of a plurality of fuse latches (FLATs 814), and NAND gate (812). Each FLAT (814) compares the address input ADDs with a pre-programmed address, which identifies the defective address. When they match, the output of FADD switches to a logical 1. Otherwise, it remains at a low. When the signal $\overline{RAS}$ switches to a low, NAND gate 812 is enabled. RRDNk (810) activates $\overline{RWDEk}$ if all signals FADDs in RRDNk (810) are at a logical 1 when the signal $\overline{RAS}$ switches to a logical 0. $\overline{RWDEk}$ is driven by the gate 834, thereby activating $\overline{RWLEk}$. $\overline{WLE}$ remains at a high because $\overline{RWDEk}$ is at a logical 0 when it is enabled by the delayed $\overline{RAS}$ which, in turn, disables NAND gate (832). Similarly, if all signals FADDs in RRDN1 (820) are at a logical 1 when $\overline{RAS}$ switches to a low, RRDN1 (820) activates $\overline{RWDEl}$. $\overline{RWDEl}$ is driven by gate 834, activating $\overline{RWLEl}$. $\overline{WLE}$ remains at a logical 1 because when it is enabled by the delayed $\overline{RAS}$, $\overline{RWDEl}$ remains at a logical 0, disabling NAND gate 832. If, at least one address input does not match the pre-programmed address, FLAT keeps the output of FADD at a low potential, leaving $\overline{RWDE}$ (i.e., $\overline{RWDEk}$ or $\overline{RWDEl}$) at a high. If, both $\overline{RWDEk}$ or $\overline{RWDEl}$, remain at a high, $\overline{RWLEk}$ and $\overline{RWLEl}$ also at a high—its normal mode of operation. NAND gate 832 forces $\overline{WLE}$ to 0 when the delayed RAS switches to 0.

Figure 9:
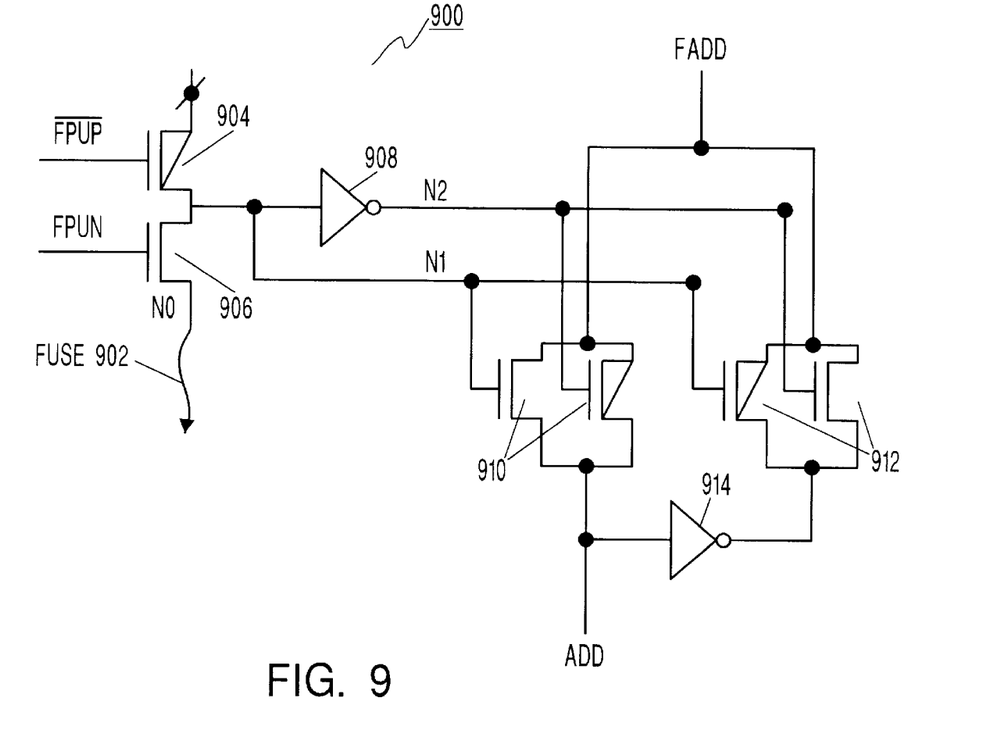
FIG. 9 illustrates a gate level schematic of the fuse latch assembly FLAT.

FIG. 9 shows a gate level schematic of the FLAT. When the chip is powered, node N1 is pulled by the PMOS when $\overline{FPUP}$ and FPUN are at a low. When FPUP and FPUN switch to a high, they disable PMOS (904), enabling NMOS (906). If the fuse (902) is not blown, node N1 discharges to a low. If the fuse (902) is blown, node N1 remains at a high. The signal N1 and the inverted signal N2 associated with the inverter (908) couple the CMOS passing gates (910) and (912). When N1 and N2 are, respectively, at a low and at a high (the fuse is not blown), the pass gate (912) opens, coupling the inverted signal ADD associated with inverter (914) to the output of FADD. When N1 and N2 are, respectively, at a high and at a low, namely, when the fuse is blown, the passing gate (910) opens, coupling the signal ADD to the output FADD. The polarity of the output FADD is determined by the signal ADD and by the state of the pre-programmed fuse, making it possible to obtain redundant match detection.

Figure 10:
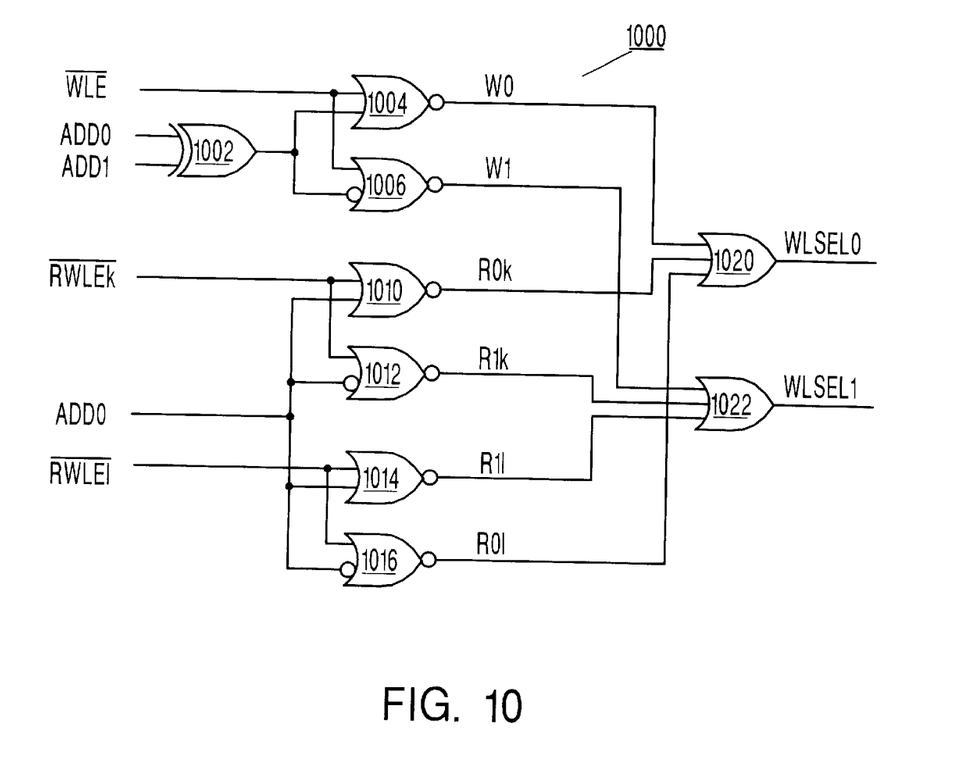
FIG. 10 shows a gate level schematic of a second embodiment of the word line select circuit WLSEL using a bit map similar to the bit map shown in FIG. 6.

Referring now to FIG. 10, there is shown a second embodiment of circuit WLSEL. The array configuration used for the present embodiment of WLSEL is the same as that shown in FIG. 6.

In FIG. 10, WLSEL0 and WLSEL1 are reordered regardless of its mode of operation, i.e., normal or redundancy mode. Unlike the first embodiment shown in FIG. 7, the addressing sequence within Uj is reversed to WLj+1 and WLj. Similarly, the addressing sequence of RUl is likewise reversed to WLl+1 and WLl. The address sequencing within Ui is the same as was previously described, i.e., WLi and WLi+1. Similarly, the address sequencing within RUk is the same as in the previous case i.e., RWLk and RWLk+1. By reordering Uj and RUl, all units U and RU can ensure bit map consistency for the replacement scheme under consideration.

Referring now to FIG. 10, there is a gate level schematic of the word line select circuit WLSEL to illustrate the second embodiment of the present invention. When in normal mode of operation, $\overline{WLE}$ switches to a low, enabling gates 1004 and 1006. When ADD0 and ADD1 are both at a low (high), the output from gate 1002 remains at a low, activating gate 1004. The signal W0 switches to a high, activating WLSEL0. When ADD0 and ADD1 are at a low and at a high (or high and low), respectively, the output from the gate 1002 switches to a high, activating gate 1006. W1 shifts to a high, activating WLSEL1. In a redundant mode of operation, either $\overline{RWLEk}$ or $\overline{RWLEl}$ switch to a low. When the signal $\overline{RWLEk}$ switches to a low, gates 1010 and 1012 become active. When ADD0 shifts back to a low, gate 1010 activates R0k. Switching R0k to a high, activates gate 1020, enabling WLSEL0. When ADD0 is at a high, gate 1012 activates the signal R1k. Switching R1k to a high activates gate 1022, thereby activating WLSEL1. When $\overline{RWLEl}$ switches to a low, it enables gates 1014 and 1016. When ADD0 is at a low, gate 1014 activates activates shifting to a high activates gate 1022, thereby activating WLSEL1. When ADD0 is at a high, gate 1016 activates R0. Switching R01 to a high activates the gate 1020 and activates WLSEL0.

In another embodiment of the invention, the same bit map is implemented irrespective of its mode of operation, i.e., a normal mode or a redundancy mode, by rewiring WLSEL0 and WLSEL1 to the blocks WD and RWD. Unlike the first and the second embodiments, WDi and RWDk are coupled to WLSEL1, while WDi+1 and RWDk+1 are coupled to WLSEL0.

Figure 11:
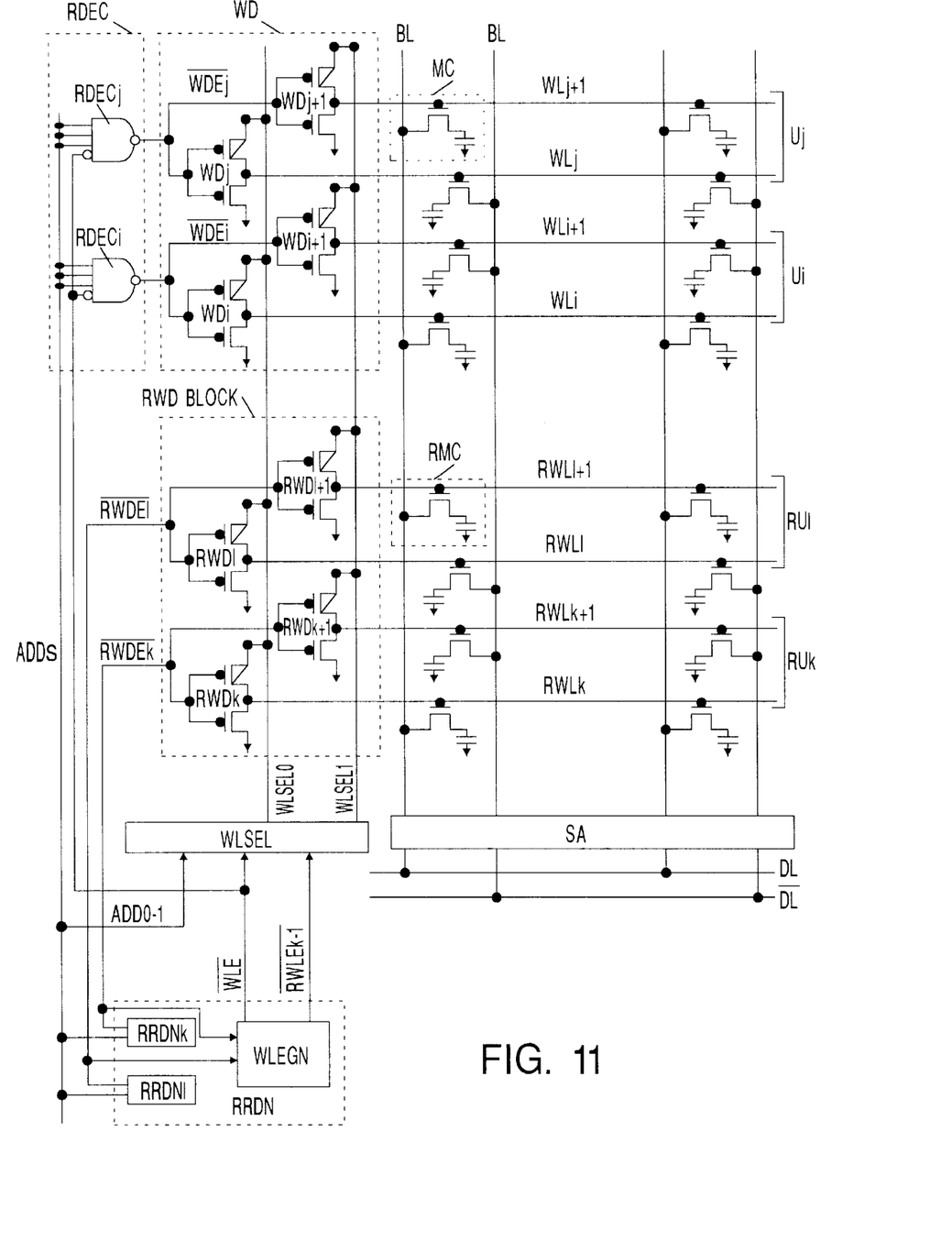
FIG. 11 shows a gate level schematic of a third embodiment of the word line select circuit WLSEL.

FIG. 11 shows a detailed array configuration similar to that shown in FIG. 6 which was previously used to describe the first and second embodiments of the circuit WLSEL, except that WLSEL0 is coupled to WDi+1 and WDj, and WLSEL1 is coupled to WDi and WDj+1. In a similar manner, WLSEL0 is coupled to RWDk+1 and RWD1, and WLSEL1 is coupled to RWDk and RWD1+1. This rewiring makes it possible to achieve bit map consistency without reordering the sequence of WLSEL0 and WLSEL1.

Figure 12:
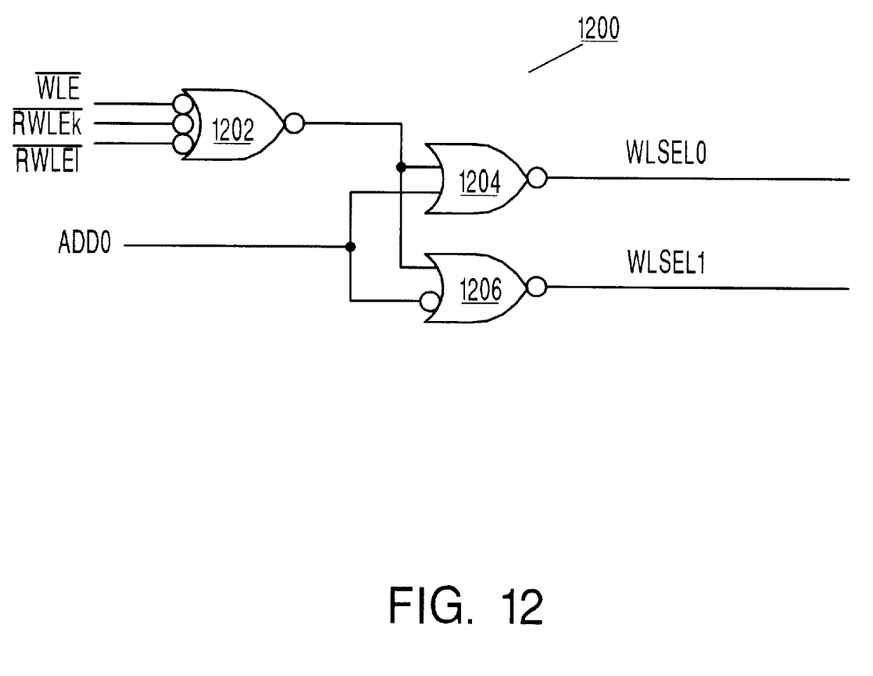
FIG. 12 shows a gate level representation of the word line select circuit WLSEL controlling the sequence of WLSEL0 and WLSEL1.

FIG. 12 shows a gate level representation of WLSEL to control the sequence of $\overline{WLSEL0}$ and WLSEL1. In either, normal or redundancy modes, when one of the signals $\overline{WLE}$, $\overline{RWLEk}$, $\overline{RWLEl}$ switch to a low, gate 1202 turns on, thereby enabling gates 1204 and 1206. When ADD0 stands at 0, WLSEL0 shifts to a 1. When ADD0 is at a 1, WLSEL1 also shifts to 1.

For simplicity sake, only two RU units (i.e., RUk an RUl) are assumed to be present, even though this is not required. By way of example, to control four RUs (RUk, RUl, RUm, RUn), the corresponding $\overline{RWDEs}$ ($\overline{RWDEk}$, $\overline{RWDEl}$, $\overline{RWDEm}$, $\overline{RWDEn}$) need to be designed. $\overline{RWLEk}$ controls RUk and RUm, while $\overline{RWLEl}$ controls RUl and RUn.

While particular embodiments of the present invention have been described, it will be understood by those skilled in the art that this invention is not limited thereto since modifications may be made, such as interchanging word lines with bit lines, and/or having data lines adopt a similar arrangement concerning redundancies which have been described herein with respect to word lines, without departing from the spirit and the scope of the underlying invention.

What is claimed is:

1. A semiconductor memory device comprising:

memory cells arranged in rows and columns, said memory cells including normal memory cells and redundant memory cells for replacing defective ones of said normal memory cells;

bit lines pairs connected to said memory cells, each bit line pair consisting of first and second bit lines which are respectively connected to memory cells for storing true data and memory cells for storing complementary data in corresponding ones of said columns;

word lines, said word lines including normal word lines each respectively connected to said normal memory cells in a corresponding one of said rows and redundant word lines each respectively connected to said redundant memory cells in a corresponding one of said rows, said normal word lines including a first normal word line for selecting a first normal memory cell for storing true data connected to the first bit line of one of said bit line pairs and a second normal word line for selecting a second normal memory cell for storing complementary data connected to the second bit line of said one of said bit line pairs, and said redundant word lines including a first redundant word line for selecting a first redundant memory cell for storing true data connected to the first bit line of said one of said bit line pairs and a second redundant word line for selecting a second redundant memory cell for storing complementary data connected to the second bit line of said one of said bit line pairs, said first normal word lines being replaced by the same number of said first redundant word lines, wherein ordering said first normal word lines is independent of ordering said first redundant word lines, and said second normal word lines being replaced by the same number of said second redundant word lines, wherein ordering said second normal word lines is independent of ordering said second redundant word lines; and decoding means for maintaining consistency of at least one bit map, wherein said decoding means is responsive to a word line enable signal, to at least one redundant word line enable signal and to at least one address input.

2. The semiconductor memory device according to claim 1, wherein said first normal word lines and said second normal word lines are replaced simultaneously.

3. The semiconductor memory device according to claim 1, wherein said decoding means achieve said consistency of said at least one bit map by reordering an addressing sequence of said word lines.

4. The semiconductor memory device according to claim 1, wherein said decoding means is a selector circuit.

5. The semiconductor memory device according to claim 1, wherein said word line enable signal and said redundant word line enable signal are controlled by a redundant control circuit.

6. The semiconductor memory device according to claim 5, wherein said redundant control circuit includes redundant match detection logic, said redundant control circuit activating either said word line enable signal or one of said redundant word line enable signals.

7. The semiconductor memory device according to claim 6, wherein said redundant match detection logic is controlled by comparing a plurality of address inputs with predetermined address inputs.

8. The semiconductor memory device according to claim 7, wherein said address and said predetermined address comparison is enabled by a fuse latch circuit.

9. The semiconductor memory device according to claim 8, wherein said fuse latch consists of at least one fuse.

10. The semiconductor memory device according to claim 9, wherein said fuse is selected from the group consisting of a laser programmable fuse, an electrical programmable fuse, and a soft-programmable fuse.

11. The semiconductor memory device according to claim 1, wherein said word line enable signal controls a plurality of row decoders.

12. The semiconductor memory device according to claim 11, wherein said row decoders are decoded by at least one address, said decoders activating a corresponding one of a plurality of word line drivers.

13. The semiconductor memory device according to claim 12, wherein said word line driver is further decoded by said word line select signals, said word line driver activating a corresponding one of said word lines.

14. The semiconductor memory device according to claim 1, wherein said redundant word line enable signal activates a corresponding one of said redundant word line drivers.

15. The semiconductor memory device according to claim 14, wherein said word line driver is further decoded by said word line select signals, said redundant word line driver activating a corresponding one of said redundant word lines.

16. The semiconductor memory device according to claim 3, wherein said consistency of said bit map is achieved by wiring at least two selecting lines, each of said at least two selecting signals being coupled to a corresponding word line driver, said word line driver activating a corresponding one of said word line or of said redundancy word lines.

17. A semiconductor memory device comprising:
   memory cells arranged in rows and columns, said memory cells including normal memory cells and redundant memory cells for replacing defective ones of said normal memory cells;
   bit line pairs connected to said memory cells, each bit line pair consisting of first and second bit lines which are respectively connected to memory cells for storing true data and memory cells for storing complementary data in corresponding ones of said columns;
   word lines, said word lines including normal word lines each respectively connected to said normal memory cells in a corresponding one of said rows and redundant word lines each respectively connected to said redundant memory cells in a corresponding one of said rows, said normal word lines including a first normal word line for selecting a first normal memory cell for storing true data connected to the first bit line of one of said bit line pairs and a second normal word line for selecting a second normal memory cell for storing complementary data connected to the second bit line of said one of said bit line pairs, and said redundant word lines including a first redundant word line for selecting a first redundant memory cell for storing true data connected to the first bit line of said one of said bit line pairs and a second redundant word line for selecting a second redundant memory cell for storing complementary data connected to the second bit line of said one of said bit line pairs,
   said first normal word lines being replaced by the same number of said first redundant word lines, wherein ordering said first normal word lines is independent of ordering said first redundant word lines, and
   said second normal word lines being replaced by the same number of said second redundant word lines, wherein ordering said second normal word lines is independent of ordering said second redundant word lines;
   address ordering means for reordering an addressing sequence of said true and said complementary word lines; and
   decoding means responsive to a word line enable signal, to at least one redundant word line enable signal, and to at least one address input.

18. A semiconductor memory device comprising:
   memory cells arranged in rows and columns, said memory cells including normal memory cells and redundant memory cells for replacing defective ones of said normal memory cells;
   bit lines pairs connected to said memory cells, each bit line pair consisting of first and second bit lines which are respectively connected to memory cells for storing true data and memory cells for storing complementary data in corresponding ones of said columns;
   word lines, said word lines including normal word lines each respectively connected to said normal memory cells in a corresponding one of said rows and redundant word lines each respectively connected to said redundant memory cells in a corresponding one of said rows, said normal word lines including a first normal word line for selecting a first normal memory cell for storing true data connected to the first bit line of one of said bit line pairs and a second normal word line for selecting a second normal memory cell for storing complementary data connected to the second bit line of said one of said bit line pairs, and said redundant word lines including a first redundant word line for selecting a first redundant memory cell for storing true data connected to the first bit line of said one of said bit line pairs and a second redundant word line for selecting a second redundant memory cell for storing complementary data connected to the second bit line of said one of said bit line pairs,
   said first normal word lines being replaced by the same number of said first redundant word lines, wherein ordering said first normal word lines is independent of ordering said first redundant word lines, and
   said second normal word lines being replaced by the same number of said second redundant word lines, wherein ordering said second normal word lines is independent of ordering said second redundant word lines; and address ordering means for reordering an addressing sequence of said true and said second redundant word lines; and decoding means for maintaining consisting of at least one bit map, wherein said decoding means is responsive to a word line enable signal, to at least one redundant word line enable signal, and to at least one address input.

19. A method for repairing a semiconductor memory device, the memory device having memory cells connected to bit lines arranged in rows and columns, the memory cells connected to bit lines and including normal memory cells and redundant memory cells, wherein the normal memory cells are connected to first normal word lines and to second normal word lines and the redundant memory cells are connected to first redundant word lines and to second redundant word lines, said method comprising the steps of:

replacing said first normal word lines by the same number of said first redundant word lines, ensuring that ordering said first normal word lines is independent of ordering said first redundant word lines, and replacing said second normal word lines by the same number of said second redundant word lines, ensuring that ordering said second normal word lines is independent of ordering said second redundant word lines; and maintaining consistency of at least one bit map when ordering said first redundant word lines and said second redundant word lines by way of a selector circuit, the selector circuit being responsive to a word line enable signal, to at least one redundant word line enable signal, and to at least one address input.

20. The method of claim 19, wherein said first normal word lines and said second normal word lines are replaced simultaneously.

21. The method of claim 19, further comprising the step of maintaining consistency of at least one bit map when executing said ordering of said first redundant word lines and said second redundant word lines.

* * * * *